United States Patent
Komatsu

(10) Patent No.: US 7,744,408 B2
(45) Date of Patent: Jun. 29, 2010

(54) HOLDING MEMBER, MOUNTING STRUCTURE IN WHICH HOLDING MEMBER IS MOUNTED ON ELECTRONIC CIRCUIT BOARD, AND ELECTRONIC COMPONENT INCLUDING HOLDING MEMBER

(75) Inventor: Seiji Komatsu, Aichi (JP)

(73) Assignee: Tyco Electronics Japan G.K., Kanagawa-Ken (JP)

( * ) Notice: Subject to any disclaimer, the term of this patent is extended or adjusted under 35 U.S.C. 154(b) by 0 days.

(21) Appl. No.: 12/362,103

(22) Filed: Jan. 29, 2009

(65) Prior Publication Data

US 2009/0190318 A1    Jul. 30, 2009

(30) Foreign Application Priority Data

Jan. 30, 2008    (JP) ............................. 2008-019278

(51) Int. Cl.
    *H01R 13/73* (2006.01)
(52) U.S. Cl. .................................................... 439/567
(58) Field of Classification Search ................ 439/567, 439/554, 555, 557, 571
    See application file for complete search history.

(56) References Cited

U.S. PATENT DOCUMENTS

| | | | | |
|---|---|---|---|---|
| 5,154,634 A | * | 10/1992 | Brown et al. ................ | 439/553 |
| 5,316,500 A | * | 5/1994 | Vanaleck et al. ............ | 439/567 |
| 5,322,452 A | * | 6/1994 | Mosquera .................... | 439/567 |
| 5,478,257 A | * | 12/1995 | Cachina et al. ............. | 439/567 |
| 5,529,514 A | | 6/1996 | Gargiulo | |
| 5,613,877 A | * | 3/1997 | Patel et al. .................. | 439/567 |
| 5,899,771 A | * | 5/1999 | Clark et al. ................. | 439/567 |
| 6,280,248 B1 | * | 8/2001 | Mitra .......................... | 439/571 |
| 6,361,384 B1 | * | 3/2002 | Manor et al. ................ | 439/883 |
| 6,679,727 B1 | * | 1/2004 | Yu .............................. | 439/567 |
| 7,052,317 B2 | * | 5/2006 | Hara et al. .................. | 439/567 |
| 7,081,014 B2 | * | 7/2006 | Pan et al. .................... | 439/567 |
| 7,500,872 B2 | * | 3/2009 | Takahashi et al. .......... | 439/567 |

FOREIGN PATENT DOCUMENTS

| | | |
|---|---|---|
| JP | 6-62486 | 9/1994 |
| JP | 2007-128772 | 5/2007 |

* cited by examiner

*Primary Examiner*—Gary F. Paumen
(74) *Attorney, Agent, or Firm*—Barley Snyder LLC

(57) ABSTRACT

A holding member, for an electronic component inserted into a through hole provided in an electronic circuit board which includes a plate-shaped base that is fixed to the electronic component, a first leg and a second leg. The first leg extends from the base, and is inserted into the through hole. The first leg has a catch that projects laterally and outwardly with respect to an inserting direction in which the first leg is inserted into the through hole and locked with an edge of the through hole after the first leg is inserted. The second leg extends from the base and is inserted into the through hole together with the first leg. The second leg elastically deforms when the second leg comes into contact with an inner surface of the through hole, presses the first leg to an opposite side inner surface of the through hole, and elastically holds the catch in a state in which the catch is locked with the edge of the through hole after the second leg is inserted.

16 Claims, 8 Drawing Sheets

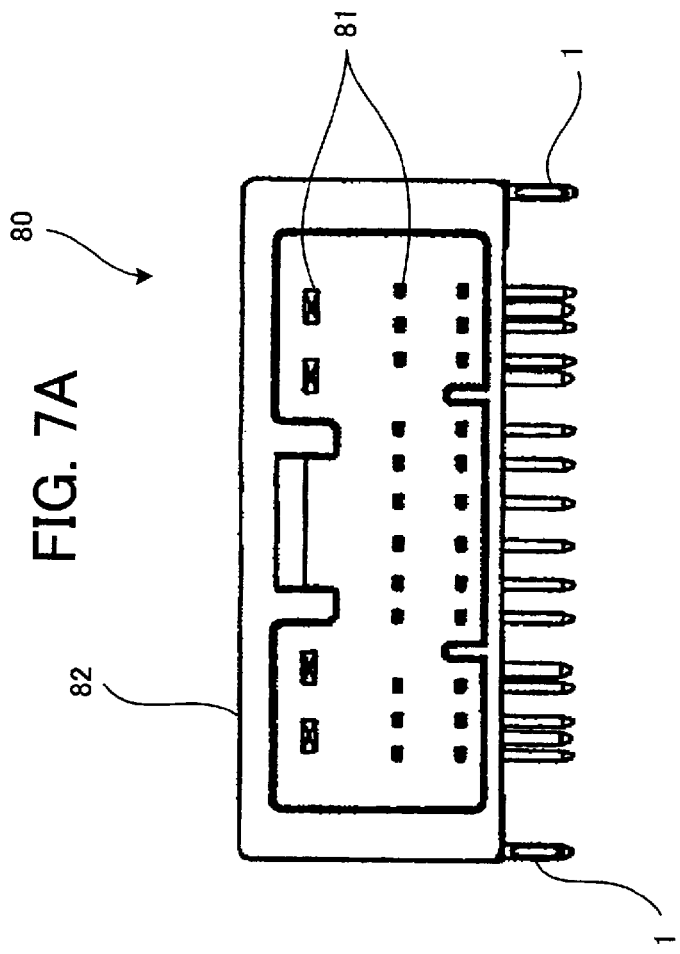
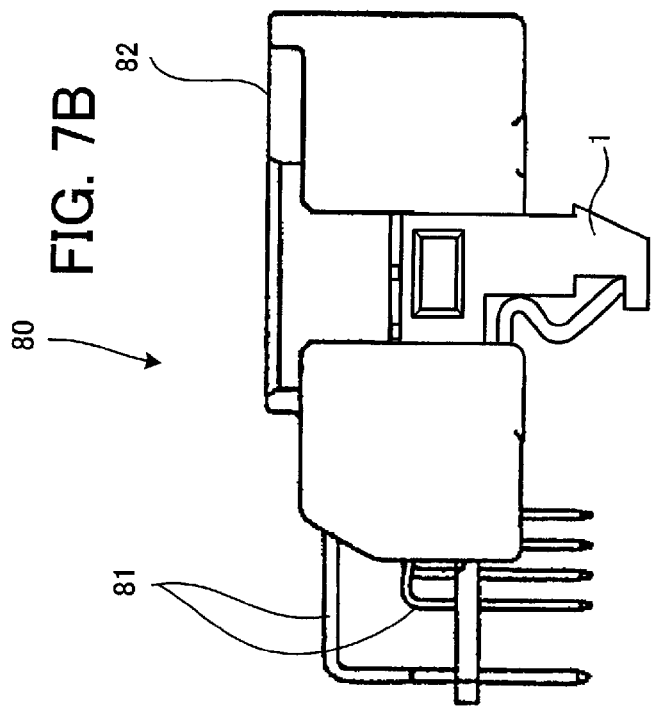
FIG. 7A
FIG. 7B

HOLDING MEMBER, MOUNTING
STRUCTURE IN WHICH HOLDING MEMBER
IS MOUNTED ON ELECTRONIC CIRCUIT
BOARD, AND ELECTRONIC COMPONENT
INCLUDING HOLDING MEMBER

CROSS-REFERENCE TO RELATED APPLICATIONS

This application claims the benefit of the filing date under 35 U.S.C. §119(a)-(d) of Japanese Patent Application No. 2008-019278, filed Jan. 30, 2008.

FIELD OF THE INVENTION

The present invention relates to a holding member that is inserted into a through hole provided in an electronic circuit board so as to hold an electronic component on the electronic circuit board, as well as a mounting structure in which the holding member is mounted on the electronic circuit board.

BACKGROUND

Conventionally, a technique for mounting an electronic component, such as a connecter, on an electronic circuit board, is well known, in which a holding member attached to an electronic component is pressed into a through hole formed in an electronic circuit board, with the holding member securing the electronic component on the electronic circuit board. Furthermore, in order to firmly fix an electronic component to an electronic circuit board, the holding member may be soldered to the electronic circuit board.

Japanese Utility Model Application Publication No. H6-62486 and U.S. Pat. No. 5,529,514 disclose such a holding member, where the holding member is elastically deformed in a plane direction and formed by stamping a metal plate, so as to press the holding member into a through hole of an electronic circuit board. The holding member has a shape in which a latch is provided on each of the outer sides respectively of a pair of legs extending in a bifurcated manner from a head part fixed to a connector. When the legs of the holding member are plunged into the through hole of the electronic circuit board, the latch thereof penetrate the through hole of the electronic circuit board and hook on the electronic circuit board. Accordingly, even in a state where the holding member fixed to the connecter is simply plunged into the through hole and is not yet soldered thereto, the connector can be held by the holding member so as not to be detached from the electronic circuit board. However, the holding member is planar, and the pair of legs are configured to be elastically deformed only in a plane direction. Accordingly, compared to a spring which is to be elastically deformable in a board thickness direction, a larger force to cause elastic deformation is required, and it is difficult to reduce a spring constant. In addition, an amount of elastic deformation is small, and a range up to plastic deformation is small. Accordingly, cut surfaces of the pair of legs obtained by stamping a metal plate are to forcibly come into contact with an inner surface of the through hole when the legs are plunged thereinto. Therefore, the inner surface of the through hole may be damaged.

As a holding member to deal with such a problem, for example, proposed is a holding member which has a pair of legs extending from a plate-like base fixed to a connector in a substantially same direction, respectively having broad spring pieces being elastically deformable in a board thickness direction, and facing with each other (for example, refer to Japanese Patent Application Publication No. 2007-128772). When the holding member is plunged into a through hole, the pair of legs are elastically deformed in a board thickness direction. Then, the holding member is held such that a pair of legs comes into plane contact with an inner surface of the through hole so that the holding member is not detached from an electronic circuit board, in a state where the holding member is simply plunged into the through hole and is not soldered. Furthermore, according to the holding member, each of the outer surfaces respectively of a pair of legs gently comes into plane contact with the inner surface of the through hole when the holding member is pressed into the through hole, so that damage on the inner surface of the through hole can be prevented. However, the holding member has a disadvantage in that it is difficult to increase elasticity (spring constant) of the legs. Accordingly, the holding force of the holding member, in the state of being simply plunged into the through hole and not yet soldered thereto, is small. Therefore when, for example, the holding member is handled and moved by a robot in this state, or, when the holding member is strongly pulled in this state, the legs of the holding member may be easily pulled out from the through hole.

SUMMARY

The present invention has been made in view of the above circumstances and provides a holding member in which the legs thereof are prevented from falling out of a through hole, when the holding member is simply positioned into the through hole and not yet soldered thereto, and causing damage to an inner surface of the through hole, as well as a mounting structure in which the holding member is mounted on an electronic circuit board and an electronic component having the holding member.

According to the invention, a holding member, is inserted into a through hole provided in an electronic circuit board and holds an electronic component on the electronic circuit board. It includes a plate-shaped base that is fixed to the electronic component, a first leg and a second leg. The first leg extends from the base, and is inserted into the through hole. The first leg has a catch that projects laterally and outwardly with respect to an inserting direction in which the first leg is inserted into the through hole and locked with an edge of the through hole after the first leg is inserted. The second leg extends from the base and is inserted into the through hole together with the first leg. The second leg elastically deforms when the second leg comes into contact with an inner surface of the through hole, presses the first leg to an opposite side inner surface of the through hole, and elastically holds the catch in a state in which the catch is locked with the edge of the through hole after the second leg is inserted.

According to the invention, a mounting structure includes an electronic circuit board that is provided with a through hole, a holding member that has legs inserted into the through hole and holds an electronic component on the electronic circuit board, and a solder that fills the through hole in a state in which the legs are inserted thereinto, in order to fix the holding member to the electronic circuit board. The holding member includes a plate-shaped base that is fixed to the electronic component, a first leg that extends from the base and is inserted into the through hole, and has a catch, wherein the catch, projecting laterally and outwardly with respect to an inserting direction in which the first leg section, is inserted into the through hole and secured with an edge of the through hole after the first leg is inserted. The holding member also including a second leg that extends from the base and is also inserted into the through hole, elastically deforming when the second leg comes into contact with an inner surface of the through hole, presses the first leg to an opposite side inner surface of the through hole, and elastically holds the catch in a state in which the catch is locked with the edge of the through hole after the second leg is inserted.

According to the invention, an electronic component, which is held on an electronic circuit board provided with a through hole, includes a holding member that has legs inserted into the through hole and holds the electronic component on the electronic circuit board, wherein the holding member includes a plate-shaped base that is fixed to the electronic component, a first leg and a second leg. The first leg section, which extends from the base, is inserted into the through hole, has a catch, which projects laterally and outwardly with respect to an inserting direction in which the first leg is inserted into the through hole and locked with an edge of the through hole after the first leg is inserted. The second leg extends from the base, is inserted into the through hole together with the first leg, is elastically deformed by coming into contact with an inner surface of the through hole, presses the first leg to an opposite side inner surface of the through hole, and elastically holds the catch in a state in which the catch is locked with the edge of the through hole after the second leg is inserted.

BRIEF DESCRIPTION OF THE DRAWINGS

FIG. 7A and FIG. 7B are a lateral view and a front view, respectively, illustrating the connector which is the embodiment of the electronic component of the invention.

FIG. 7B is held on the electronic circuit board.

DETAILED DESCRIPTION OF THE EMBODIMENT(S)

Figure 1A:
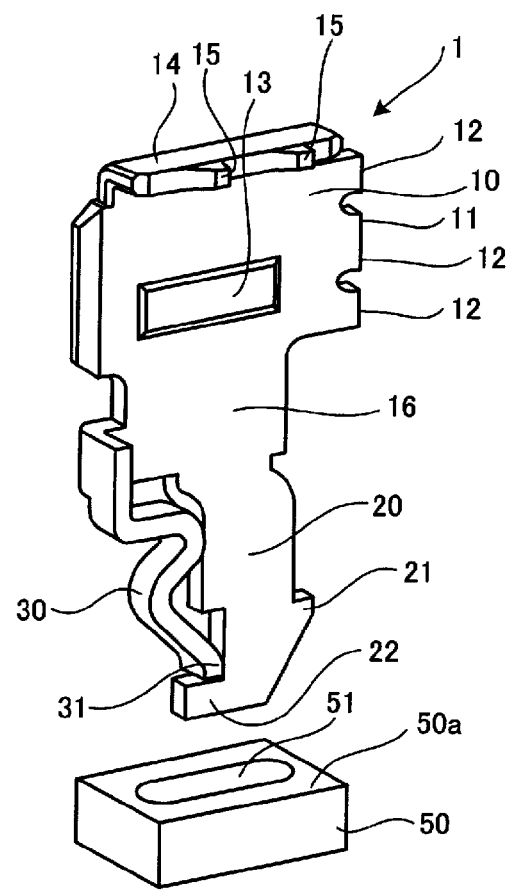
FIG. 1A and FIG. 1B are a perspective view and a longitudinal sectional view, respectively, illustrating a process in which a holding member of the invention is inserted into a through hole provided in an electronic circuit board.
Figure 1B:
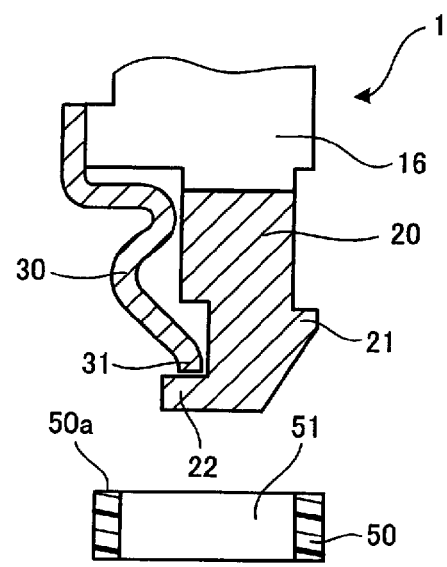
Figure 2A:
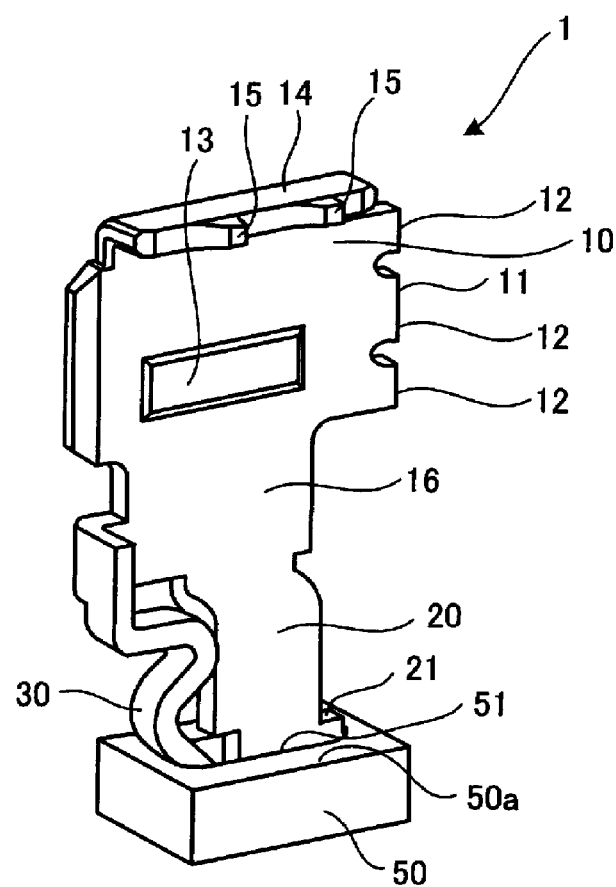
FIG. 2A and FIG. 2B are a perspective view and a longitudinal sectional view, respectively, illustrating the process in which the holding member is inserted into the through hole provided to the electronic circuit board.
Figure 2B:
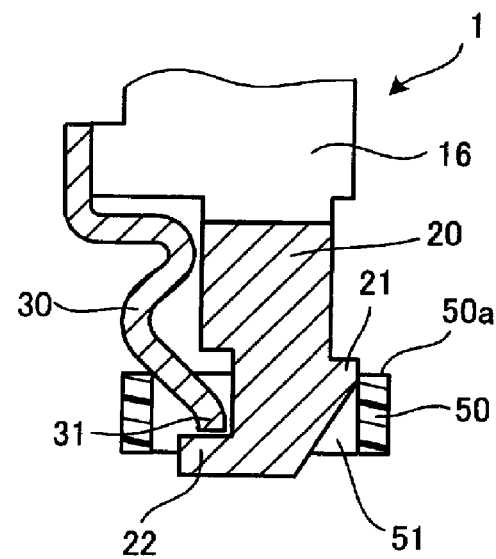
Figure 3A:
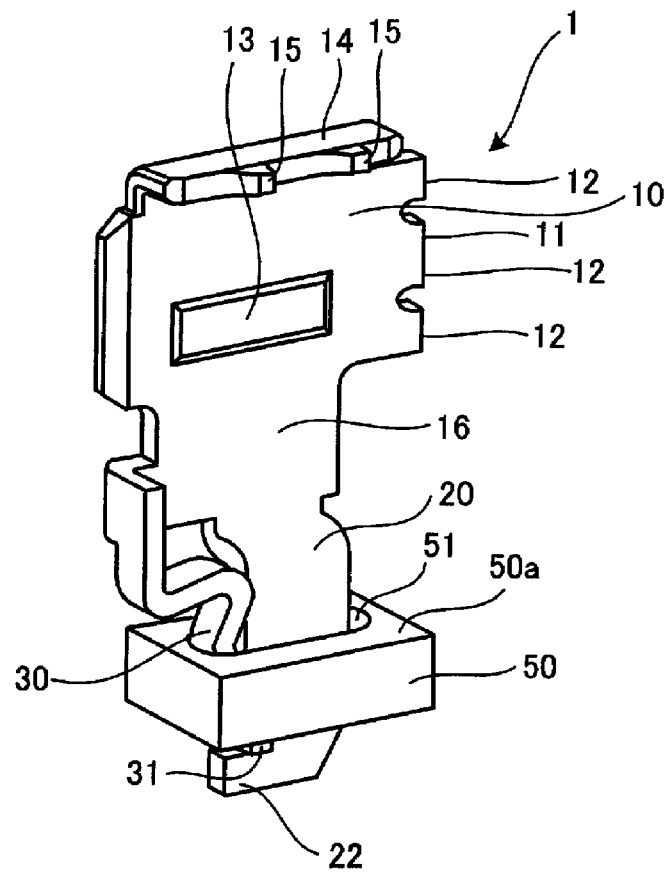
FIG. 3A and FIG. 3B are a perspective view and a longitudinal sectional view, respectively, illustrating the process in which the holding member is inserted into the through hole provided to the electronic circuit board.
Figure 3B:
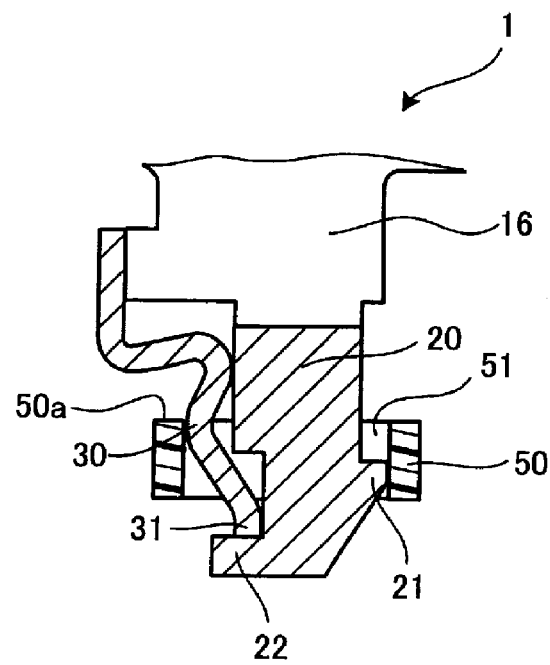
Figure 4A:
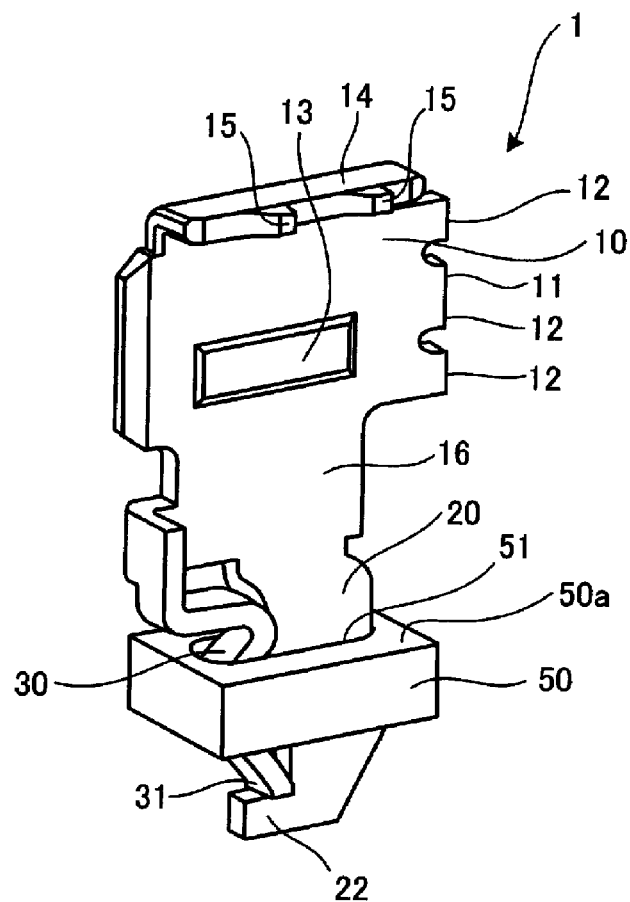
FIG. 4A and FIG. 4B are a perspective view and a longitudinal sectional view, respectively, illustrating the process in which the holding member is inserted into the through hole provided to the electronic circuit board.
Figure 4B:
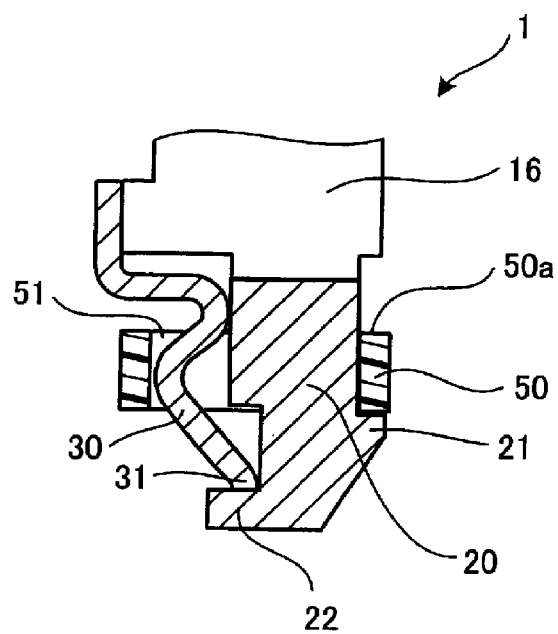

Hereinafter, an embodiment of the invention will be described with reference to the drawings.

FIG. 1A to FIG. 4B are views illustrating a process in which a holding member 1 is inserted into a through hole 51 provided in an electronic circuit board 50. In FIG. 1 to FIG. 4, FIG. 1A, FIG. 2A, FIG. 3A, and FIG. 4A are perspective views, while FIG. 1B, FIG. 2B, FIG. 3B, and FIG. 4B are longitudinal sectional views.

The electronic circuit board 50 is provided with the through hole 51 formed therein in advance, and, on an inner surface of the through hole 51 and on the electronic circuit board 50 in the vicinity of the through hole 51, a copper plating layer, which is not illustrated in the drawings, is formed. A typical thickness of the electronic circuit board 50 is in a range from 1.2 mm to 1.6 mm.

The holding member 1 is inserted from the side of a mounting surface 50a into the through hole 51, provided in the electronic circuit board 50, so as to hold a connector on the electronic circuit board 50. The holding member 1 is formed by subjecting a copper alloy, such as a brass board, to stamping, pressing, and bending processes. Furthermore, the holding member 1 is subjected to, for example, tin plating process so that a surface thereof can be wet by molten solder. Here, the plating process of the holding member 1 is not limited to the tin plating process, and may be, for example, solder plating process or gold plating process. The holding member 1 includes a base 10, a first leg 20, and a second leg 30.

The base 10 has a extension 16 that projects downwardly from one side of a rectangular shape. A lateral edge 11 of the base 10 is provided with base projections 12. The base 10 is press-fitted into a groove provided within a side surface of an insulating housing of the connector and fixed therein. The base projections 12 are for preventing holding member 1 from falling out. Furthermore, a bent section 14, located at an upper end of the base 10, is provided with bent section projections 15. The bent section projections 15 are also for preventing the holding member 1 from falling out, similarly to the base projections 12. Any one of the projections 12, 15 may be used in accordance with an attachment method of the connector to the insulating housing. Furthermore, in the base 10, a rib 13 for enhancing the strength against bending moment, created during the pressing process. In the base 10, from the extension 16 projecting downwardly from one side of the rectangular shape, the first leg 20 and the second leg 30 extend in a substantially same direction.

The first leg 20 is a part to be inserted into the through hole 51, provided in the electronic circuit board 50, while being pressed to an inner surface of the through hole 51. The first leg 20 has a catch 21 that projects laterally and outwardly with respect to an inserting direction in which the first leg 20 is inserted into the through hole 51 and locked with an edge of the through hole 51 after insertion. Furthermore, the first leg 20 has, at a tip part of the first leg 20, a restricting section 22 that extends to a position being located further to a tip side of the first leg 20 than a tip 31 of the second leg 30 and facing the tip 31 of the second leg 30 and that restricts extension of the second leg 30 towards the tip side.

The second leg 30 is to be inserted together with the first leg 20 into the through hole 51. The second leg 30 is shaped to extend in a direction of insertion into the through hole 51. The shape prepared by first bending substantially orthogonally from one end side of the extension 16 towards the first leg 20, then folds back from a point adjacent to the first leg 20 away from the first leg 20 so as to have a substantially arc shape, and then extends to such a position that the tip 31 is again adjacent to the restricting section 22 of the first leg 20. This substantially arc shape part is a spring. Here, the width of the second leg 30, that is, the width of a rear surface, which is a part being coming into contact with an inner surface of the through hole 51 and opposed to a surface facing the first leg 20, is larger than the board thickness of the holding member 1. Accordingly, when the second leg 30 is inserted into the through hole 51, the rear surface comes into contact with the inner surface of the through hole 51 and the second leg 30 is elastically deformed so as to press the first leg 20 to the other inner surface opposed to the inner surface of the through hole 51, and elastically holds the catch 21 in the state of being locked with an edge of the through hole 51 after being inserted.

According to the holding member 1 of the embodiment, without damaging the inner surface of the through hole 51, the holding member 1 in the state of being simply inserted into the through hole 51 and not yet being soldered thereto is held by the catch 21, which is to be locked with an edge of the through hole 51, so as not to be separated from the electronic circuit board 50. Thereby, the first leg 20 and the second leg 30 are prevented from falling out from the through hole 51.

Furthermore, according to the holding member 1 of the embodiment, since the holding member 1 has the restricting section 22, it is prevented that the second leg 30 which is elastically deformed when the first leg 20 and the second leg 30 are inserted into the through hole 51 is excessively deformed and becomes unrecoverable after being inserted.

Furthermore, the holding member 1 of the embodiment is configured to have the first leg 20 having the catch 21 to be locked with the edge of the through hole 51 after being inserted and to have the second leg 30 elastically holding the catch 21 in the state of being locked with the edge of the through hole 51 after being inserted, so that a pair of the first leg 20 and the second leg 30 share functions with each other. Accordingly, the holding member 1 of the embodiment has an advantage that the second leg 30 is hardly excessively deformed.

The holding member 1 inserted into the through hole 51 is soldered to the electronic circuit board 50 together with a terminal of the connector in solder flow process.

Next, a mounting structure, in which the holding member 1 is fixed to the electronic circuit board 50 by soldering, will be described in accordance with a process of performing soldering in solder flow process.

Figure 5:
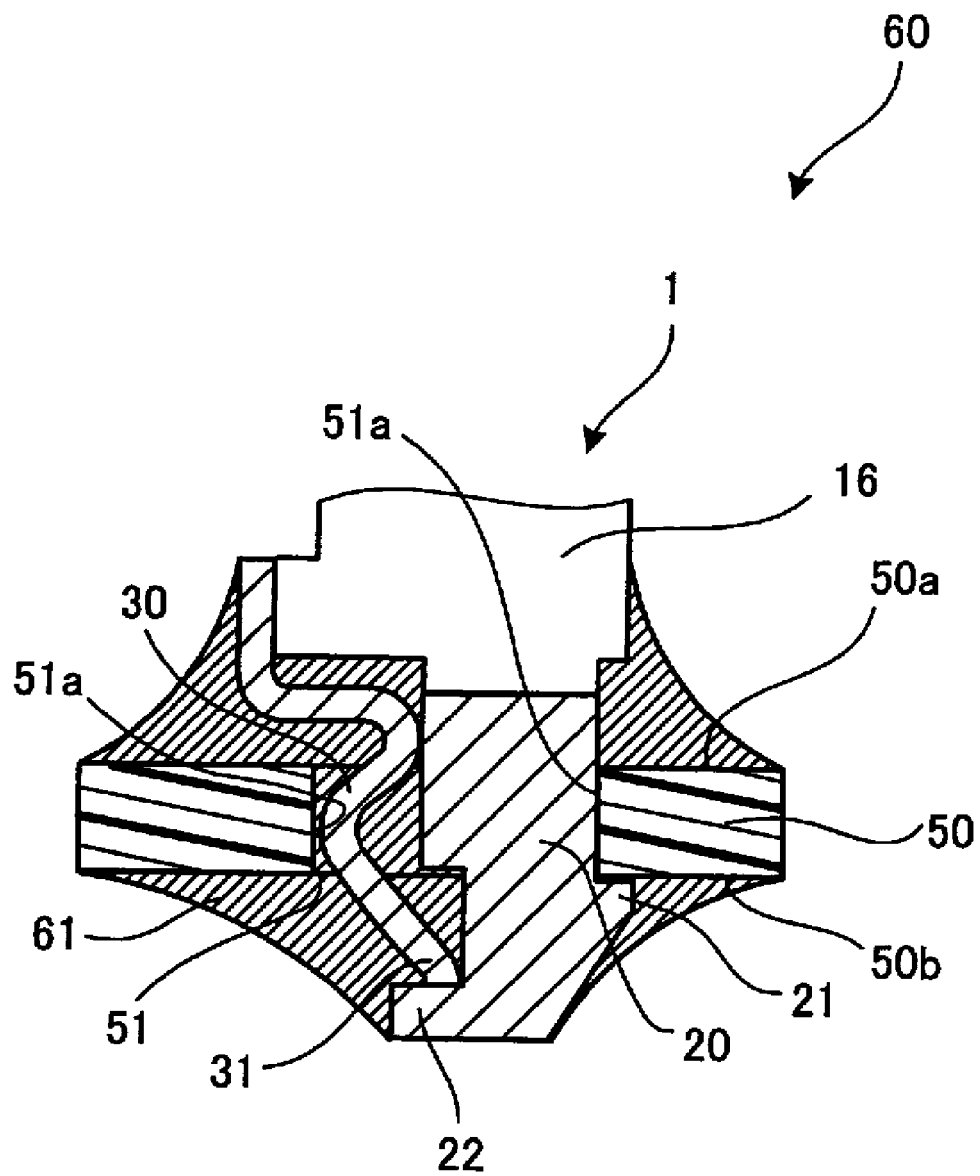
FIG. 5 is a cross-sectional view illustrating a mounting structure in which the holding member is fixed to the electronic circuit board by a solder flow process.

FIG. 5 is a view illustrating a mounting structure 60 in which the holding member 1 described above is fixed to the electronic circuit board 50 by soldering.

Furthermore, while illustrating the mounting structure 60 in which the holding member 1 is fixed to the electronic circuit board 50 by soldering, FIG. 5 also illustrates the status in which molten solder attaches to the electronic circuit board 50 and the holding member 1 in the solder flow process. Here, both solder in a molten state and solder in a solid state in the solder flow process are denoted by the same reference numeral 61 in the following descriptions.

In the solder flow process, in the state where the holding member 1 is being inserted into the through hole 51, a solder surface 50b of the electronic circuit board 50 is immersed into molten solder 61. Then, an inner surface 51a of the through hole 51, a copper plating layer (not shown in the drawing) formed on the mounting surface 50a in the vicinity of the through hole 51, and the holding member 1 are covered by the molten solder 61. The molten solder 61 climbs up in the through hole 51 by going along a surface of the first leg 20 and the second leg 30 and the inner surface 51a of the through hole 51. Furthermore, the molten solder 61 is also soaked up by capillary action. Then, the molten solder 61, soaked up into the through hole 51, climbs up along the surfaces of the first leg 20 and the second leg 30.

As a result, as illustrated in FIG. 5, the molten solder 61 completely fills in the through hole 51, and is further soaked up from the through hole 51 to the mounting surface 50a of the electronic circuit board 50. Then, on the mounting surface 50a of the electronic circuit board 50, solder fillet is formed which spans across the first leg 20 and the second leg 30 and the mounting surface 50a of the electronic circuit board 50.

The mounting structure 60 is formed when the molten solder 61 is cooled down and solidified after the solder flow process. On the solder surface 50b of the electronic circuit board 50, solder fillet which spreads across the first leg 20 and the second leg 30 and the solder surface 50b is formed by the solder 61. Furthermore, on the mounting surface 50a, the solder fillet is also formed which spreads across the first leg 20 and the second leg 30 and the mounting surface 50a. Note that, the mounting structure 60 illustrated in FIG. 5 corresponds to an example of the mounting structure of the invention.

According to the mounting structure 60 of the embodiment, the electronic circuit board 50 and the first leg 20 and the second leg 30 of the holding member 1 are soldered with each other. Accordingly, the holding member 1 is firmly fixed to the electronic circuit board 50. In other words, a connecter having the holding member 1 is solidly fixed to the electronic circuit board 50 after being subjected to the soldering process.

Hereinafter, a connector which is held on the electronic circuit board 50 by the holding member 1 will be described.

Figure 6:
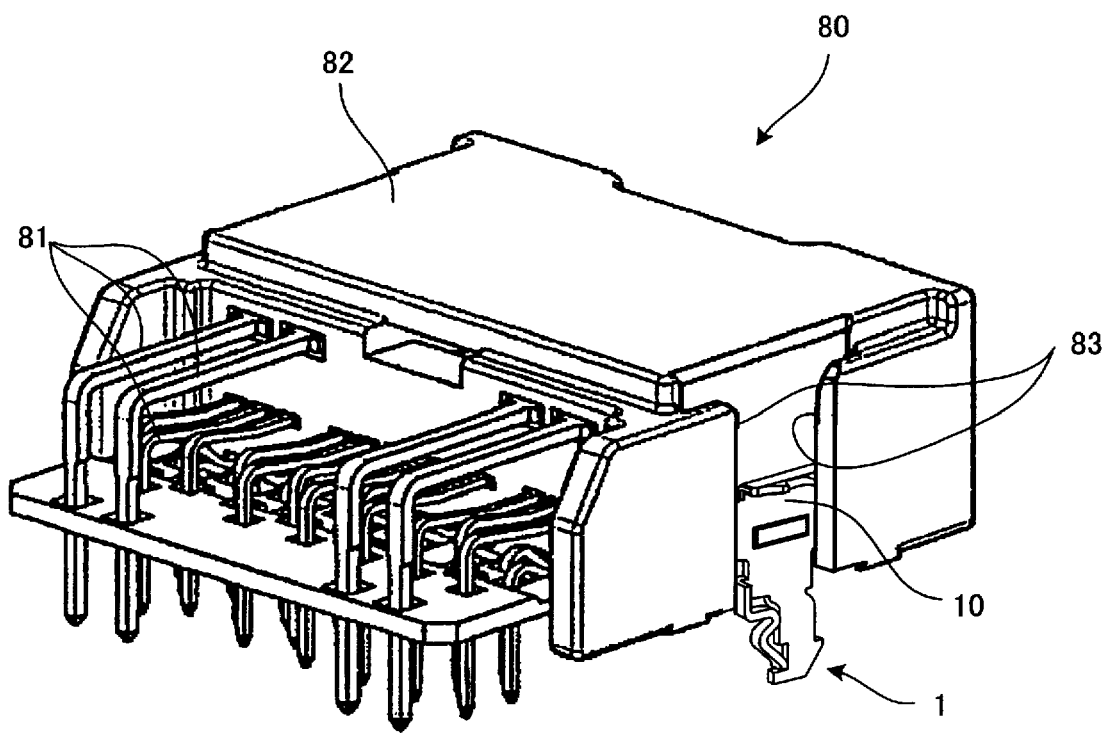
FIG. 6 is a perspective view illustrating a connector which is an embodiment of an electronic component of the invention.

FIG. 6, FIG. 7A, and FIG. 7B are views illustrating a connector 80 which is an embodiment of an electronic component of the invention. FIG. 6 is a perspective view of the connector 80 viewed from obliquely behind. Here, FIG. 7A is a lateral view, and FIG. 7B is a front view.

The connector 80 is mounted on an electronic circuit board, and electrically connects a circuit on the electronic circuit board and another circuit when being engaged with a counterpart connector of a pair (not illustrated in the drawing).

The connector 80 has the holding member 1 described above, a contact 81 that is to be connected to a circuit on the electronic circuit board 50, and a housing 82 that fixes the holding member 1 and the contact 81. When the base 10 of the holding member 1 is press-fitted into a groove 83 that is provided to the connector 80, the holding member 1 is attached to the connector 80.

Figure 8:
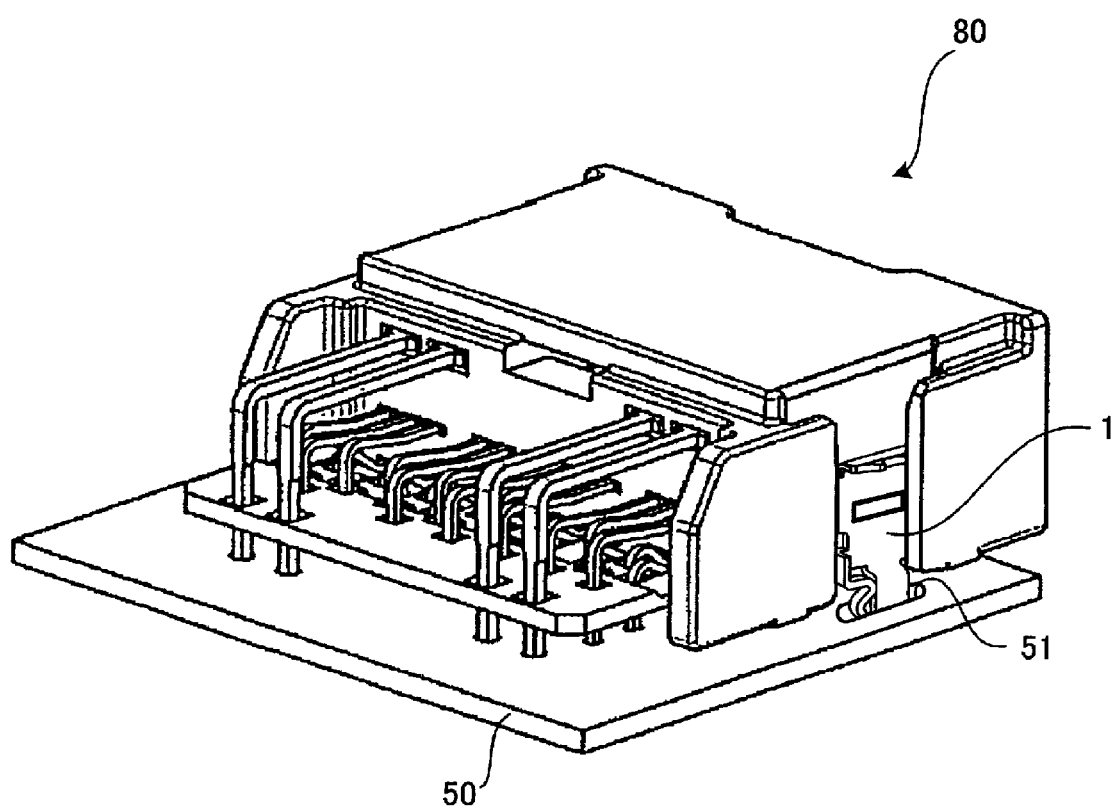
FIG. 8 is a view illustrating the state in which the connector illustrated in FIG. 6, FIG. 7A

FIG. 8 is a view illustrating the state in which the connector 80 illustrated in FIG. 6, FIG. 7A, and FIG. 7B is held on the electronic circuit board 50.

When the holding member 1 is inserted into the through hole 51, the connector 80 is held on the electronic circuit board 50. After the electronic circuit board 50 in this state is subjected to the solder flow process, the holding member 1 is soldered to the electronic circuit board 50.

According to the connector 80 of the embodiment, without damaging the inner surface of the through hole 51, the connector 80 in the state of being simply inserted into the through hole 51 and not yet being soldered thereto is held by the catch 21, which is to be locked with the edge of the though hole 51, so as not to be separated from the electronic circuit board 50. In other words, the first leg 20 and the second leg 30 are prevented from falling out from the through hole 51.

Here, in the embodiment, descriptions have been given for the connector 80 as an example of an electronic component of the invention. However, the invention is not limited to this, and can also be applied to another electronic component held by a holding member to an electronic circuit board.

Furthermore, as for the connector 80 of the embodiment, an example thereof has been described in which soldering is performed in the solder flow process after the holding member 1 is firstly attached to the connector 80. However, the invention is not limited to this. For example, it may be configured that the holding member 1 is firstly soldered to the electronic circuit board 50 as illustrated in FIG. 5, and then the holding member 1 is fixed to the connector 80.

Furthermore, in this embodiment, an example has been described in which soldering is performed in the solder flow process. However, the invention is not limited to this. Soldering can also be performed in, for example, solder reflow process by filling solder paste into a through hole in advance or soldering process using a soldering iron (so-called hand soldering process).

Furthermore, in this embodiment, it has been described that the holding member 1 is made of brass plated with tin. However, the invention is not limited to this. The holding member 1 may be made of any metal as long as the surface thereof can be wet by molten solder. For example, if a holding member is made of a copper alloy, such as brass, as the holding member 1 of the embodiment, tin plating process can be omitted.

What is claimed is:

1. A holding member for holding an electronic component on an electronic circuit board comprising:
    a plate-shaped base that is fixed to the electronic component;
    a first leg extending from the base, inserted into the through hole, and having a catch, the catch projecting laterally and outwardly with respect to an inserting direction in which the first leg is inserted into the through hole and being secured with an edge of the through hole after the first leg is inserted; and
    a second leg extending from the base, and inserted into the through hole together with the first leg section; the second leg being elastically deformed by coming into contact with an inner surface of the through hole and pressing the first leg toward an opposite side inner surface of the through hole, so that the second leg elastically holds the catch in a state in which the catch is secured with the edge of the through hole after the second leg is inserted.

2. The holding member according to claim 1, wherein the first leg has a restricting section that restricts extension of the second leg to a tip side.

3. The holding member according to claim 2, wherein the restricting section is positioned at a tip of the first leg.

4. The holding member according to claim 3, wherein the restricting section extends to a position that is located further to the tip side of the holding member than a tip of the second leg and that position faces the tip of the second leg.

5. The holding member according to claim 1, wherein the second leg has a shape in which the second leg extends from the base in a direction of insertion into the through hole.

6. The holding member according to claim 5, wherein the shaped of the second leg first bends towards the first leg section, then folds back from a point adjacent to the first leg section, and then extends away from the first leg extending to such a position that a tip thereof is again adjacent to the first leg in a substantially arc shape.

7. The holding member according to claim 4, wherein the second leg has a shape in which the second leg extends from the base in a direction of insertion into the through hole.

8. The holding member according to claim 7, wherein the shaped of the second leg first bends towards the first leg section, then folds back from a point adjacent to the first leg section, and then extends away from the first leg extending to such a position that a tip thereof is again adjacent to the first leg in a substantially arc shape.

9. The holding member according to claim 1, wherein the holding member is made of metal which surface can be wet by molten solder.

10. The holding member according to claim 4, wherein the holding member is made of metal which surface can be wet by molten solder.

11. The holding member according to claim 6, wherein the holding member is made of metal which surface can be wet by molten solder.

12. The holding member according to claim 1, wherein the holding member is provided with base projections.

13. The holding member according to claim 1, wherein the holding member is provided with a bent section, located at an upper end of the base, the bent section provided with bent section projections.

14. The holding member according to claim 1, wherein the holding member is provided with a rib, the rib enhancing the strength against a bending moment created by the pressing process.

15. A mounting structure comprising:
    an electronic circuit board that is provided with a through hole;
    a holding member that has legs inserted into the through hole and holds an electronic component on the electronic circuit board; and
    solder that fills the through hole in a state in which the leg sections are inserted thereinto so as to secure the holding member to the electronic circuit board,
    wherein the holding member comprises:
    a plate-shaped base that is fixed to the electronic component;
    a first leg extending from the base, inserted into the through hole, and having a catch, the catch projecting laterally and outwardly with respect to an inserting direction in which the first leg is inserted into the through hole and being secured with an edge of the through hole after the first leg is inserted; and
    a second leg extending from the base, and inserted into the through hole together with the first leg section; the second leg being elastically deformed by coming into contact with an inner surface of the through hole and pressing the first leg toward an opposite side inner surface of the through hole, so that the second leg elastically holds the catch in a state in which the catch is secured with the edge of the through hole after the second leg is inserted.

16. An electronic component that is held on an electronic circuit board provided with a through hole, comprising:
    a holding member that has leg sections inserted into the through hole and holds the electronic component on the electronic circuit board,
    wherein the holding member comprises:
    a plate-shaped base that is fixed to the electronic component;
    a first leg that extends from the base, is inserted into the through hole, and has a catch, the catch projecting laterally and outwardly with respect to an inserting direction in which the first leg is inserted into the through hole and being secured with an edge of the through hole after the first leg is inserted; and
    a second leg that extends from the base, is inserted into the through hole together with the first leg section, the second leg is elastically deformed by coming into contact with an inner surface of the through hole and presses the first leg toward an opposite side inner surface of the through hole, so that the second leg elastically holds the catch in a state in which the catch is secured with the edge of the through hole after the second leg is inserted.

* * * * *

UNITED STATES PATENT AND TRADEMARK OFFICE
CERTIFICATE OF CORRECTION

PATENT NO. : 7,744,408 B2  
APPLICATION NO. : 12/362103  
DATED : June 29, 2010  
INVENTOR(S) : Seiji Komatsu Page 1 of 1

It is certified that error appears in the above-identified patent and that said Letters Patent is hereby corrected as shown below:

Column 7  
In claim 1, line 28, "through hole and pressing" should read -- through hole and engaging and pressing --.

Column 8  
In claim 15, line 36, "through hole and pressing" should read -- through hole and engaging and pressing --.

Column 8  
In claim 16, line 59, "through hole and presses" should read -- through hole and engages and presses --.

Signed and Sealed this

Sixteenth Day of November, 2010

David J. Kappos  
*Director of the United States Patent and Trademark Office*